(12) United States Patent
Lee et al.

(10) Patent No.: US 8,705,304 B2
(45) Date of Patent: Apr. 22, 2014

(54) CURRENT MODE SENSE AMPLIFIER WITH PASSIVE LOAD

(75) Inventors: Seong-Hoon Lee, Boise, ID (US); Onegyun Na, Boise, ID (US); Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 33 days.

(21) Appl. No.: 12/732,968

(22) Filed: Mar. 26, 2010

(65) Prior Publication Data

US 2011/0235450 A1 Sep. 29, 2011

(51) Int. Cl.
*G11C 7/00* (2006.01)
*G11C 7/02* (2006.01)

(52) U.S. Cl.
USPC ............. 365/205; 365/207; 365/208; 327/51; 327/52; 327/55; 327/57

(58) Field of Classification Search
USPC .......... 327/51, 52, 55, 57, 199; 365/205, 207, 365/208; 330/250, 253, 277, 278
See application file for complete search history.

(56) References Cited

U.S. PATENT DOCUMENTS

| | | | |
|---|---|---|---|
| 4,284,957 A | 8/1981 | Haque | |
| 4,502,020 A | 2/1985 | Nelson et al. | |
| 4,555,673 A | 11/1985 | Huijsing et al. | |
| 4,586,166 A * | 4/1986 | Shah | 327/52 |
| 4,792,923 A * | 12/1988 | Nakase et al. | 327/199 |
| 4,837,523 A | 6/1989 | Wright | |
| 4,843,343 A | 6/1989 | Pace | |
| 5,473,567 A * | 12/1995 | McClure | 365/208 |
| 5,477,497 A * | 12/1995 | Park et al. | 365/205 |
| 5,489,874 A | 2/1996 | Tanoi | |
| 5,493,533 A | 2/1996 | Lambrache | |
| 5,504,442 A * | 4/1996 | Tanoi | 327/51 |
| 5,514,986 A * | 5/1996 | Tanoi | 327/57 |
| 5,654,928 A * | 8/1997 | Lee et al. | 365/205 |
| 5,710,739 A * | 1/1998 | Calligaro et al. | 365/205 |
| 5,815,451 A | 9/1998 | Tsuchida | |
| 5,949,730 A | 9/1999 | Shirley et al. | |
| 6,127,853 A * | 10/2000 | Yu | 327/55 |
| 6,141,246 A * | 10/2000 | Derman et al. | 327/51 |
| 6,191,989 B1 | 2/2001 | Luk et al. | |
| 6,271,977 B1 | 8/2001 | Chung et al. | |
| 6,292,417 B1 | 9/2001 | Seyyedy | |
| 6,326,815 B1 * | 12/2001 | Sim et al. | 327/57 |
| 6,396,310 B2 * | 5/2002 | Shin | 327/55 |
| 6,456,161 B2 | 9/2002 | Smith | |
| 6,466,499 B1 | 10/2002 | Blodgett | |
| 6,483,351 B2 * | 11/2002 | Sim | 327/52 |
| 6,483,353 B2 * | 11/2002 | Kim et al. | 327/55 |
| 6,617,885 B2 * | 9/2003 | Lim et al. | 327/57 |
| 6,721,218 B2 * | 4/2004 | Lim | 365/205 |
| 6,738,302 B1 * | 5/2004 | Parris et al. | 365/208 |
| 6,750,714 B1 | 6/2004 | McIntyre | |
| 6,798,250 B1 | 9/2004 | Wile | |
| 6,831,503 B2 | 12/2004 | La Rosa | |
| 6,870,425 B2 | 3/2005 | Leifso et al. | |

(Continued)

*Primary Examiner* — Trong Phan
(74) *Attorney, Agent, or Firm* — Dorsey & Whitney LLP

(57) ABSTRACT

Memories, current mode sense amplifiers, and methods for operating the same are disclosed, including a current mode sense amplifier including cross-coupled p-channel transistors and a load circuit coupled to the cross-coupled p-channel transistors. The load circuit is configured to provide a resistance to control at least in part the loop gain of the current mode sense amplifier, the load circuit including at least passive resistance.

11 Claims, 5 Drawing Sheets

(56) References Cited

U.S. PATENT DOCUMENTS

| | | | |
|---|---|---|---|
| 6,879,217 B2 | 4/2005 | Visocchi | |
| 6,879,533 B2* | 4/2005 | Chae et al. | 365/205 |
| 6,894,564 B1 | 5/2005 | Gilbert | |
| 6,944,066 B1 | 9/2005 | Jing | |
| 7,038,963 B2* | 5/2006 | Lee | 365/207 |
| 7,075,368 B2 | 7/2006 | Lin et al. | |
| 7,154,331 B2 | 12/2006 | Zaguri | |
| 7,154,923 B2 | 12/2006 | Kucharski | |
| 7,218,166 B2 | 5/2007 | Yanagisawa et al. | |
| 7,262,638 B2* | 8/2007 | Shim | 327/55 |
| 7,265,620 B2 | 9/2007 | Liu et al. | |
| 7,286,011 B2 | 10/2007 | Chang et al. | |
| 7,286,425 B2 | 10/2007 | Barth, Jr. | |
| 7,342,451 B2 | 3/2008 | Brueske | |
| 7,368,991 B2 | 5/2008 | Swanson | |
| 7,446,609 B2 | 11/2008 | Lee et al. | |
| 7,477,076 B2* | 1/2009 | Miyatake | 327/55 |
| 7,521,992 B1* | 4/2009 | Hagleitner et al. | 330/253 |
| 7,564,295 B2* | 7/2009 | Ker et al. | 327/525 |
| 7,629,817 B2* | 12/2009 | Nedovic et al. | 327/55 |
| 7,777,568 B2 | 8/2010 | Lim | |
| 7,786,764 B2 | 8/2010 | Cheng | |
| 7,813,199 B2 | 10/2010 | Morgan | |
| 7,889,006 B1 | 2/2011 | Jones | |
| 7,956,641 B1 | 6/2011 | Peng et al. | |
| 7,990,792 B2* | 8/2011 | Abe et al. | 365/207 |
| 8,030,972 B2 | 10/2011 | Jansson | |
| 8,049,535 B2* | 11/2011 | Van Tran et al. | 327/52 |
| 8,283,950 B2 | 10/2012 | Willey | |
| 8,289,796 B2 | 10/2012 | Lee | |
| 8,344,806 B1 | 1/2013 | Franck et al. | |
| 8,472,898 B2 | 6/2013 | Rofougaran | |
| 2003/0179842 A1 | 9/2003 | Kane et al. | |
| 2006/0220459 A1 | 10/2006 | Kulasekeram | |
| 2006/0273831 A1 | 12/2006 | Maksimovic et al. | |
| 2009/0267668 A1 | 10/2009 | Lin | |
| 2011/0182129 A1* | 7/2011 | Lee | |
| 2012/0038405 A1 | 2/2012 | Willey | |
| 2012/0326786 A1 | 12/2012 | Willey | |
| 2013/0009705 A1 | 1/2013 | Lee | |
| 2013/0015899 A1 | 1/2013 | Willey | |
| 2013/0027133 A1 | 1/2013 | Lee | |

\* cited by examiner

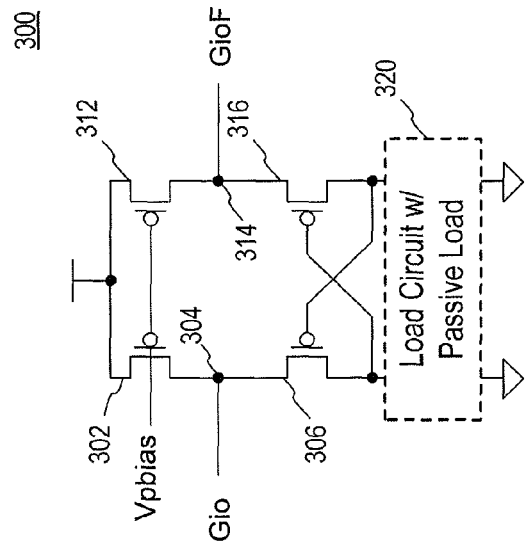
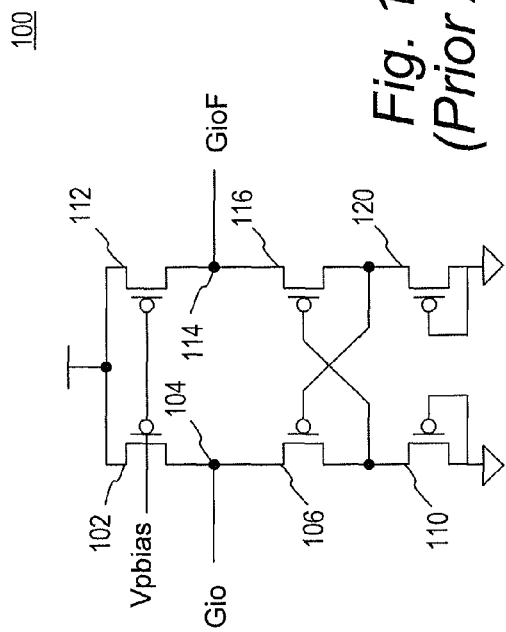
Fig. 1
(Prior Art)
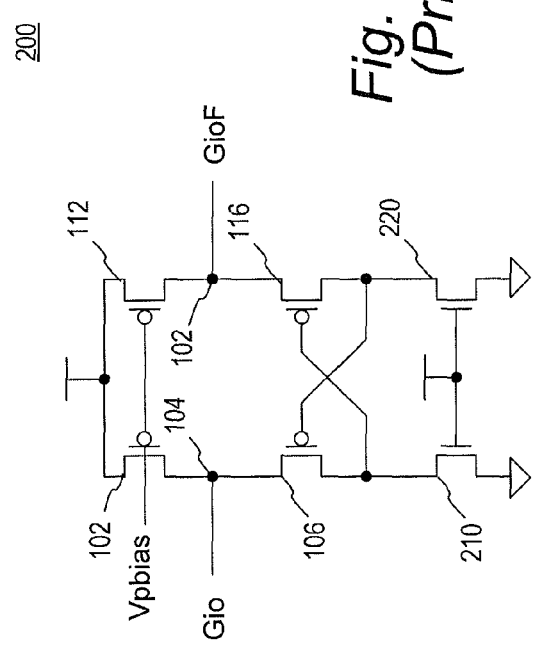
Fig. 2
(Prior Art)
Fig. 3

CURRENT MODE SENSE AMPLIFIER WITH PASSIVE LOAD

TECHNICAL FIELD

Embodiments of the invention relate generally to integrated circuits, and more particularly, in one or more of the illustrated embodiments, to integrated circuit sense amplifiers.

BACKGROUND OF THE INVENTION

Current mode sense amplifiers (CSAs) have been used in integrated circuits to sense and amplify differential input currents. In applications in semiconductor memory, for example, the CSAs are often used to sense and amplify input currents resulting from reading memory cell data and being provided over long signal lines. As a result, the input currents are typically very weak and low in magnitude. In applications such as these, control of the CSA's loop gain is important because it affects the operating characteristics of the CSA. For example, where the loop gain of a CSA is approximately equal to 1, the dominant mode of operation for the CSA is sensing differential input currents. In contrast, as the loop gain of a CSA increases to be greater than 1, the dominant mode of operation for the CSA transitions from current sensing to behaving as a latch circuit. Thus, controlling loop gain is desirable in order to control the behavior of the CSA.

FIG. 1 illustrates a conventional current mode sense amplifier (CSA) 100. The CSA 100 includes a pair of cross coupled p-channel field effect transistors (PFET) 106, 116 and diode coupled PFET transistors 110, 120 to provide active loads. PFET bias transistors 102, 112 are coupled to the PFET transistors 106, 116 and biased by a bias voltage Vpbias. Differential input currents are applied to the input-output nodes 104, 114 from input-output lines Gio, GioF to be sensed and amplified by the CSA 100. As known, the loop gain of the CSA 100 is gmR, where gm is the transconductance of PFET transistors 106, 116 and R is the load provided by the PFET transistors 110, 120. As also known, the load for the diode coupled PFET transistors 110, 120 is 1/gm. As a result, the loop gain for the CSA 100 is approximately 1, and the loop gain remains substantially constant despite variations in factors affecting gm, such as process, voltage, and temperature (PVT). Although the CSA 100 has the benefit of a being able to maintain a substantially constant loop gain for changes in PVT, for operation a supply voltage Vcc for the CSA 100 should be greater than the sum of the threshold voltages of the transistors 106 (or 116) and transistors 110 (or 120), and a voltage margin for operation. In low voltage, low power systems, however, providing a supply voltage of this level is not desirable.

FIG. 2 illustrates another conventional CSA 200. The CSA 200 includes cross coupled PFET transistors 106, 116 and bias transistors 102, 112, as in the CSA 100. The active load diode coupled PFET transistors 110, 120 of the CSA 100 have been replaced by active loads n-channel field effect transistors (NFET) 210, 220 having gates coupled to Vcc to provide load R. An advantage of the CSA 200 over the CSA 100 is that a Vcc can be less than that for CSA 100. The Vcc only needs to be greater than the threshold voltage of the transistors 106 (or 116) plus a voltage margin, which is one transistor threshold voltage less than for the CSA 100. As with CSA 100, the loop gain of the CSA 200 is gmR. In contrast to the diode coupled PFET transistors 110, 120, PVT variation of the load provided by NFET transistors 210, 220 is not correlated with the gm of transistors 106, 116. As a result, the loop gain for the CSA 200 will vary more than the loop gain for the CSA 100 of FIG. 1 would vary with PVT variations. As previously discussed, a greater variance of loop gain will cause the CSA's operating characteristics to vary greater with PVT as well, which is typically an undesirable situation.

BRIEF DESCRIPTION OF THE DRAWINGS

FIG. 1 is a schematic drawing of a conventional current mode sense amplifier.

FIG. 2 is a schematic drawing of a conventional current mode sense amplifier.

FIG. 3 is a schematic drawing of a current mode sense amplifier according to an embodiment of the invention.

DETAILED DESCRIPTION

Figures 4, 5, 6:
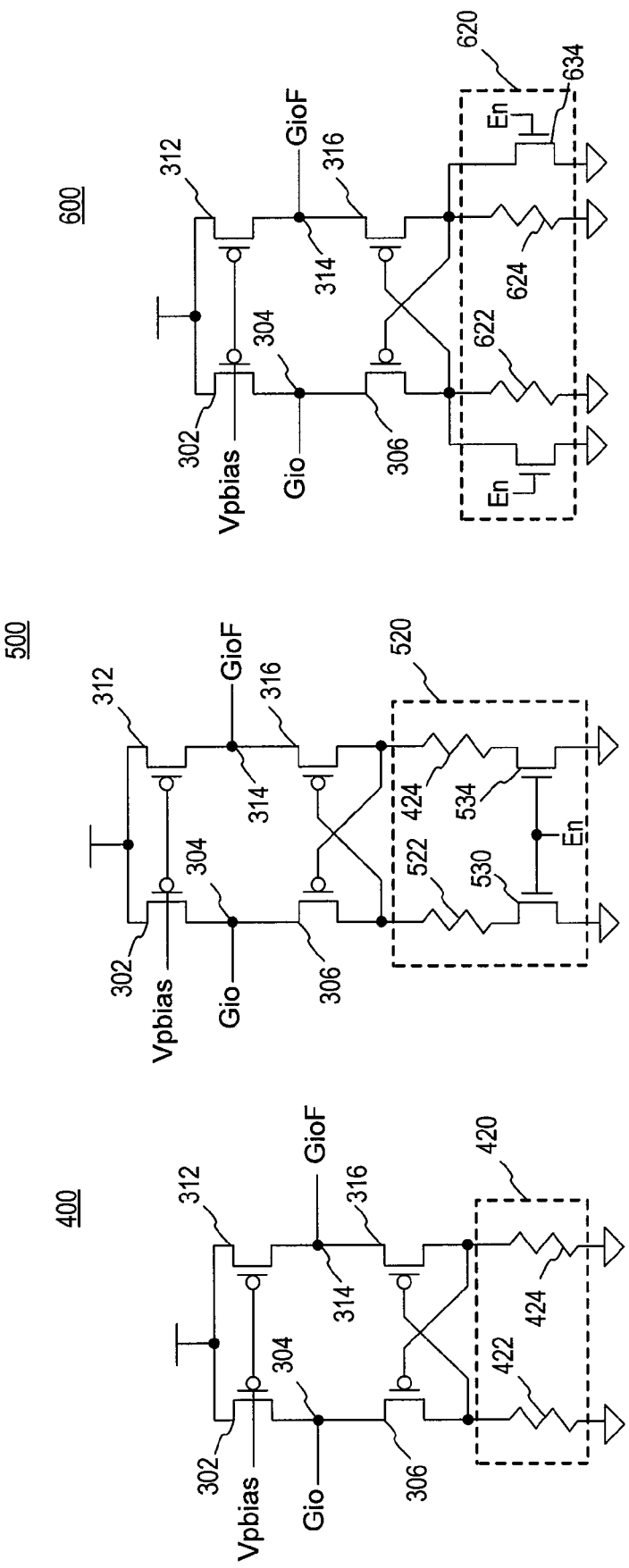
FIG. 4 is a schematic drawing of a current mode sense amplifier according to an embodiment of the invention.
FIG. 5 is a schematic drawing of a current mode sense amplifier according to an embodiment of the invention.
FIG. 6 is a schematic drawing of a current mode sense amplifier according to an embodiment of the invention.

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

FIG. 3 illustrates a current mode sense amplifier (CSA) 300 according to an embodiment of the invention. The CSA 300 includes bias transistors 302, 312 coupled to a power supply VCC and input/output (IO) nodes 304, 316. In the embodiment of FIG. 3, the transistors 302, 312, 306, 316 are shown as p-channel transistors. However, the transistors 302, 312, 306, 316 may be other types of transistors as well. Gates of the transistors 302, 312 are coupled together and receive a bias voltage signal Vpbias to set the bias condition of the CSA 300. Also coupled to the IO nodes 304, 314 are transistors 306, 316 having gates cross-coupled. A load circuit 320 including a passive load is coupled to the transistors 306, 316 and a voltage reference, for example, ground. In operation, when coupled to a power supply voltage VCC a differential in current input signals applied to the I/O nodes 306, 316 are sensed and amplified by the CSA 300.

As will be described in more detail below, the load circuit 320 may be used to influence the loop gain (i.e., gmR product)

of the CSA 300 by influencing the R component. The gm component is influenced by the transistors 306, 316. As known, transistors, such as p-channel transistors 302, 312, 306, 316, are non-linear devices having resistances that vary with varying process and temperature, and varying voltage applied to the gates and across the source-drain. As a result, the gm component of the loop gain also varies with varying process and temperature, and varying voltage applied to the gates and across the source-drain. The load circuit 320 may be used to mitigate variation (relative to prior art current mode sense amplifiers) in the loop gain by influencing the R component.

For example, FIG. 4 illustrates a CSA 400 according to an embodiment of the invention. The CSA 400 is similar to the CSA 300 in that it includes transistors 302, 312, 306, 316, and senses and amplifies a differential in current input signals applied to the I/O nodes 304, 314. The CSA 400 further includes a load circuit 420 that includes passive resistances 422, 424 coupled to the transistors 306, 316. One example of a passive resistance is a resistor. The load circuit 420 influences the R component of the loop gain (i.e., gmR product) of the CSA 400. Resistance of the passive resistances 422, 424 varies with varying process and temperature. However, the resistance does not vary with varying voltage (e.g., VCC). Thus, in comparison to a conventional CSA, such as CSA 100, 200 (FIGS. 1 and 2), having only active loads (e.g., transistors 110, 120, 210, 220) that vary with varying process and temperature, as well as with varying voltage, the passive resistances 422, 424 have reduced resistance variation, which in turn reduces variation in the loop gain of the CSA 400 due to varying voltage as compared to the CSAs 100, 200. Moreover, by having passive resistances 422, 424 in the load circuit 420, the loop gain of the CSA 400 has a square root dependency with VCC variation since the resistance of the load circuit 420 does not vary with varying VCC. That is, the loop gain decreases with decreasing VCC and increases with increasing VCC. In contrast, with an active load, such as in CSAs 100 and 200, the resistance changes inversely with varying VCC.

FIG. 5 illustrates a CSA 500 according to an embodiment of the invention. The CSA 500 is similar to the CSA 300 in that it includes transistors 302, 312, 306, 316, and senses and amplifies a differential in current input signals applied to the I/O nodes 304, 314. The CSA 500 further includes a load circuit 520 that includes passive resistances 522, 524 coupled to the transistors 306, 316 and in series with active loads 530, 534. The active loads 530, 534 are enabled by an En signal. The load circuit 520 influences the R component of the loop gain (i.e., gmR product) of the CSA 500. As previously discussed, passive resistances, such as passive resistances 522, 524, vary by varying process and temperature, but does not vary with varying voltage (e.g., VCC). Although the active loads 530, 534 vary with process, temperature and voltage, the dimensions of the active loads 530, 534 are such that the resistances are less than the resistances of passive resistances 522, 524. For example, in some embodiments of the invention, the resistances of the active loads 530, 534 may be in the range of 10% to 20% of the resistances of the passive resistances 522, 524. As a result, the overall resistance of the load circuit 520 will generally vary less than a pure active load, such as transistors 110, 120, 210, 220 of CSAs 100, 200 (FIGS. 1 and 2). The active loads 530, 534 increase the resistance of the load circuit 520 for lower VCC compared to a load circuit using only passive resistances, such as load circuit 420 (FIG. 4). The increasing resistance of active loads 530, 534 may compensate for the reduction in the gm component of loop gain (i.e., gmR product) due to the lower VCC to improve stability of the loop gain over a wider range of VCC variation. As the VCC increases, however, the resistance of the active loads 530, 534 decrease, and the resistance of the load circuit 520 is dominated by the resistances of the passive resistances 522, 524.

FIG. 6 illustrates a CSA 600 according to an embodiment of the invention. The CSA 600 is similar to the CSA 300 in that it includes transistors 302, 312, 306, 316, and senses and amplifies a differential in current input signals applied to the I/O nodes 304, 314. The CSA 600 further includes a load circuit 620 that includes passive resistances 622, 624 coupled to the transistors 306, 316 and in parallel with active loads 630, 634. The active loads 630, 634 are enabled by an En signal. The load circuit 620 influences the R component of the loop gain (i.e., gmR product) of the CSA 600. As previously discussed, passive resistances, such as passive resistances 622, 624, vary by varying process and temperature, but does not vary with varying voltage (e.g., VCC). Although the active loads 630, 634 vary with process, temperature and voltage, the active loads 630, 634 may be used to tailor the overall resistance characteristic of the load circuit 620. For example, as VCC increases the resistances of the active loads 630, 634 decrease and may offset the increasing gm of transistors 306, 316. As a result, the overall loop gain for the CSA 600 may exhibit less variation over a range of VCC compared to even the loop gain of a CSA including a load circuit primarily using a passive resistance, such as load circuit 400 (FIG. 4).

Figures 7, 8, 9:
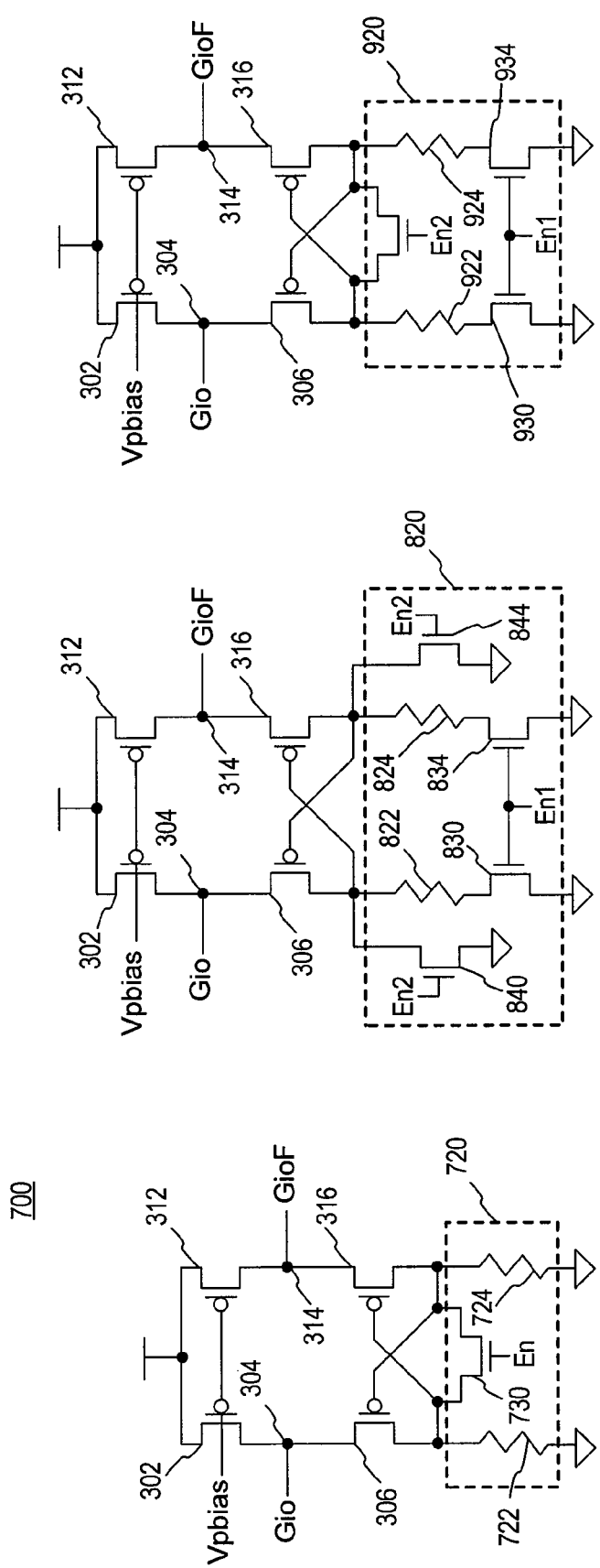
FIG. 7 is a schematic drawing of a current mode sense amplifier according to an embodiment of the invention.
FIG. 8 is a schematic drawing of a current mode sense amplifier according to an embodiment of the invention.
FIG. 9 is a schematic drawing of a current mode sense amplifier according to an embodiment of the invention.

FIG. 7 illustrates a CSA 700 according to an embodiment of the invention. The CSA 700 is similar to the CSA 300 in that it includes transistors 302, 312, 306, 316, and senses and amplifies a differential in current input signals applied to the I/O nodes 304, 314. The CSA 700 further includes a load circuit 720 that includes passive resistances 722, 724 coupled to the transistors 706, 716 and active load 730 coupled to the passive resistances 722, 724. The active load 730 is enabled by an En signal. The load circuit 720 influences the R component of the loop gain (i.e., gmR product) of the CSA 700. The active load 730 may be used to tailor the overall resistance characteristic of the load circuit 720. For example, as VCC increases the resistances of the active load 730 decreases and may offset the increasing gm of transistors 306, 316. As a result, the overall loop gain for the CSA 700 may exhibit less variation over a range of VCC and have similar loop gain characteristics as CSA 600 (FIG. 6).

FIG. 8 illustrates a CSA 800 according to an embodiment of the invention. The CSA 800 is similar to the CSA 300 in that it includes transistors 302, 312, 306, 316, and senses and amplifies a differential in current input signals applied to the I/O nodes 304, 314. The CSA 800 further includes a load circuit 820 that includes passive resistances 822, 824 coupled to the transistors 306, 316 and in series with active loads 830, 834. The load circuit 820 further includes active loads 840, 844 coupled in parallel with passive resistances 822, 824. The active loads 830, 834 are enabled by an En1 signal and the active loads 840, 844 are enabled by an En2 signal. The load circuit 820 influences the R component of the loop gain (i.e., gmR product) of the CSA 800. The load circuit 820 generally combines the series and parallel active load configuration of the load circuits 520 and 620 (FIGS. 5 and 6) and results in a loop gain for the CSA 800 that exhibits an increase for lower VCC, and a lower and stable loop gain for higher VCC of CSA 500 and 600, respectively. The loop gain of CSA 800 generally has less variation over a full range of VCC than CSAs 400, 500, 600, and 700.

FIG. 9 illustrates a CSA 900 according to an embodiment of the invention. The CSA 900 is similar to the CSA 300 in that it includes transistors 302, 312, 306, 316, and senses and amplifies a differential in current input signals applied to the I/O nodes 304, 314. The CSA 900 further includes a load circuit 920 that includes passive resistances 922, 924 coupled to the transistors 306, 316 and in series with active loads 930, 934. The load circuit 920 further includes active load 940 coupled to the passive resistances 922, 924. The active loads 930, 934 are enabled by an En1 signal and the active load 940 is enabled by an En2 signal. The load circuit 920 influences the R component of the loop gain (i.e., gmR product) of the CSA 900. The load circuit 920 generally combines the series and parallel active load configuration of the load circuits 520 and 720 (FIGS. 5 and 7) and results in a loop gain for the CSA 900 that exhibits an increase for lower VCC, and a lower and stable loop gain for higher VCC of CSA 500 and 700, respectively. The loop gain of CSA 800 generally has less variation over a full range of VCC than CSAs 400, 500, 600, and 700.

Figure 11:
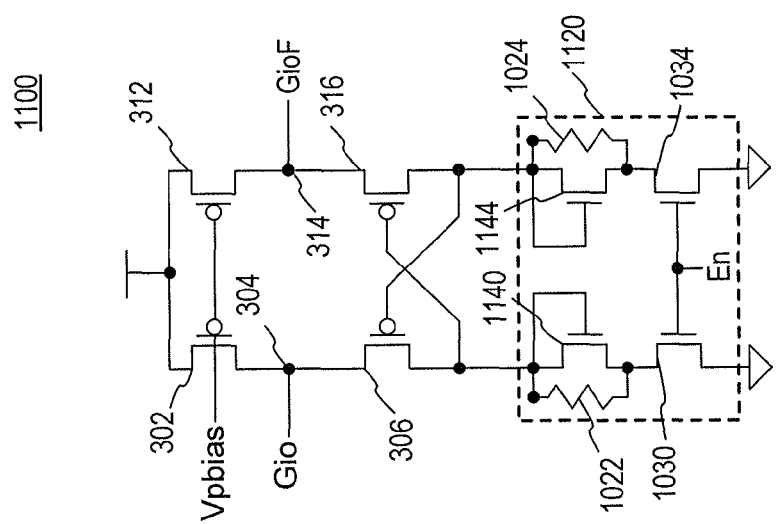
FIG. 11 is a schematic drawing of a current mode sense amplifier according to an embodiment of the invention.
Figure 10:
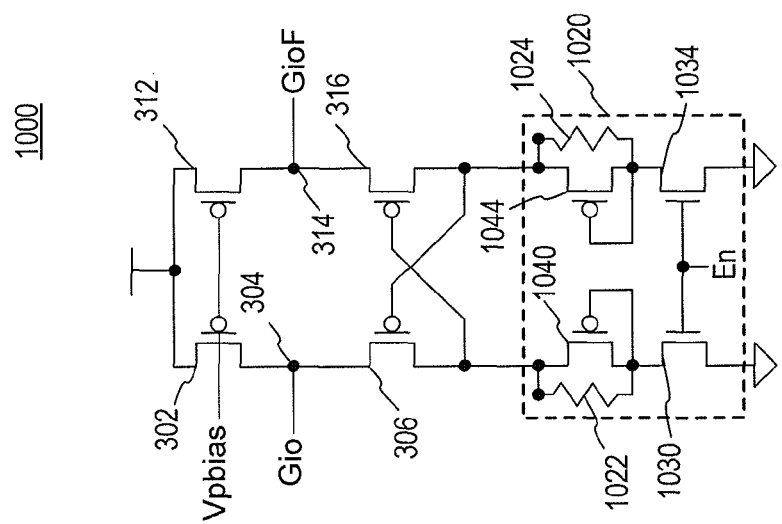
FIG. 10 is a schematic drawing of a current mode sense amplifier according to an embodiment of the invention.

FIG. 10 illustrates a CSA 1000 according to an embodiment of the invention. The CSA 1000 is similar to the CSA 300 in that it includes transistors 302, 312, 306, 316, and senses and amplifies a differential in current input signals applied to the I/O nodes 304, 314. The CSA 1000 further includes a load circuit 1020 that includes passive resistances 1022, 1024 coupled to the transistors 306, 316 and in series with active loads 1030, 1034. The load circuit 1020 further includes active loads 1040, 1044 coupled in parallel with passive resistances 1022, 1024. The active loads 1030, 1034 are enabled by an En signal and the active loads 1040, 1044 are diode coupled. As shown in FIG. 10, the active loads 1040, 1044 are p-channel transistors. Other types of transistors may be used as well. For example, FIG. 11 illustrates CSA 1100 according to an embodiment of the invention that is similar to the CSA 1000. A load circuit 1120, however, includes active loads 1140, 1144 that are shown to be diode coupled n-channel transistors in parallel with passive resistances 1022, 1024. The load circuits 1020, 1120 influence the R component of the loop gain (i.e., gmR product) of the CSAs 1000 and 1100, respectively. The load circuit 1020, 1120 generally combine passive resistances and active load configurations that result in loop gains for the CSA 1000, 1100 that exhibit increased loop gain for lower VCC, and lower and stable loop gain for higher VCC compared to, for example, conventional CSAs such as CSAs 100, 200, and may have less variation over a full range of VCC than CSAs 400, 500, 600, and 700.

Figure 12:
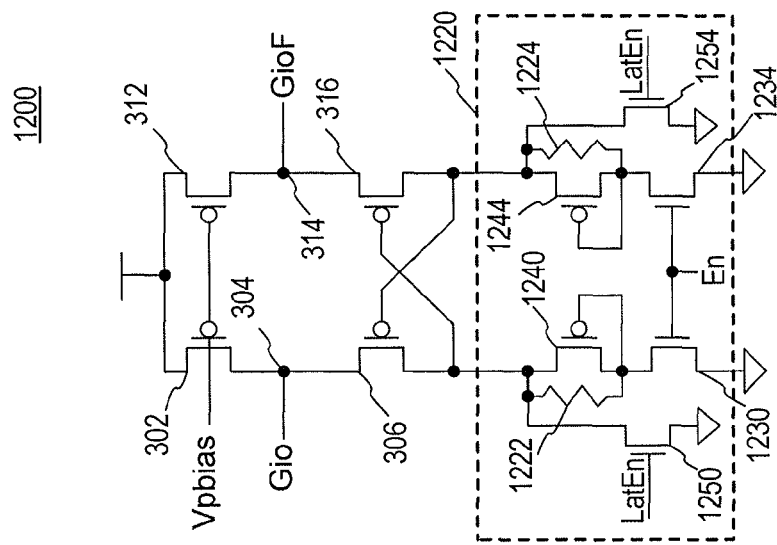
FIG. 12 is a schematic drawing of a current mode sense amplifier according to an embodiment of the invention.

FIG. 12 illustrates a CSA 1200 according to an embodiment of the invention. The CSA 1200 is similar to the CSA 300 in that it includes transistors 302, 312, 306, 316, and senses and amplifies a differential in current input signals applied to the I/O nodes 304, 314. The CSA 1200 further includes a load circuit 1220 that includes passive resistances 1222, 1224 coupled to the transistors 306, 316 and in series with active loads 1230, 1234. The load circuit 1220 further includes active loads 1240, 1244 coupled in parallel with passive resistances 1222, 1224. The active loads 1230, 1234 are enabled by an En signal and the active loads 1040, 1044 are diode coupled. Although the active loads 1040, 1044 are shown in FIG. 10 to be p-channel transistors, other types of transistors may be used as well. The load circuit 1220 further includes active loads 1250, 1254, which when enabled by an active latch enable signal LatEn, have higher resistances than the resistances for the parallel/serial load combination of passive resistances 1222, 1224, and active loads 1230, 1234, 1240, 1244. As a result, the loop gain (i.e., gmR product) increases when the active loads 1250, 1254 are enabled and when the active loads 1230, 1234 are disabled (in effect disabling the parallel/serial load combination of passive resistances 1222, 1224, and active loads 1230, 1234, 1240, 1244).

In operation, the CSA 1200 operates in the same manner as previously described. However, the active loads 1230, 1234 are enabled during sensing and amplifying of differential in current input signals applied to the I/O nodes 304, 314. The active loads are enabled by the En signal, as previously described. To latch a sensed state by the CSA 1200, the active loads 1230, 1234 are deactivated (i.e., no longer conductive) and the active loads 1250, 1254 are enabled by an active LatEn signal. With the active loads 1250, 1254 enabled and active loads 1230, 1234 disabled, the greater resistances (relative to the parallel/serial load combination) of active loads 1250, 1254 increases the R component of the loop gain for the CSA 1200. As a result, the loop gain of the CSA 1200 increases, and where the loop gain increases to be greater than 1, the CSA 1200 will behave in a manner similar to a latch circuit (i.e., putting the CSA 1200 into a "latch mode" of operation) and the sensed state by the CSA 1200 can be latched.

Figure 13:
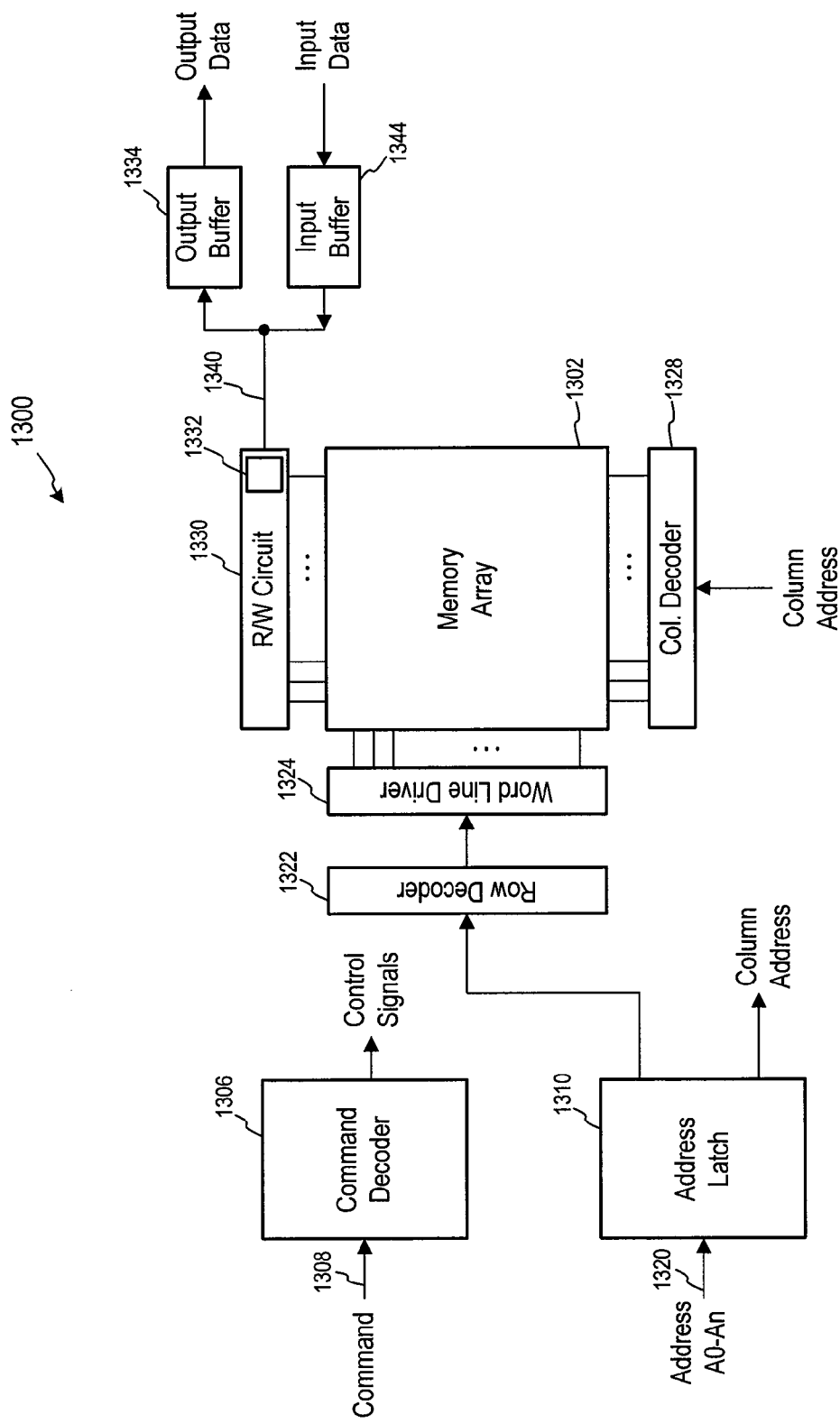
FIG. 13 is a block diagram of a memory including a current mode sense amplifier according to an embodiment of the invention.

FIG. 13 illustrates a portion of a memory 1300 according to an embodiment of the present invention. The memory 1300 includes an array 1302 of memory cells, which may be, for example, DRAM memory cells, SRAM memory cells, flash memory cells, or some other types of memory cells. The memory 1300 includes a command decoder 1306 that receives memory commands through a command bus 1308 and generates corresponding control signals within the memory 1300 to carry out various operations. For example, the command decoder 1306 responds to memory commands applied to the command bus 1308 to perform various operations on the memory array 1302. In particular, the command decoder 1306 is used to generate internal control signals to read data from and write data to the memory array 1302. Row and column address signals are applied to the memory 1300 through an address bus 1320 and provided to an address latch 1310. The address latch then outputs a separate column address and a separate row address.

The row and column addresses are provided by the address latch 1310 to a row address decoder 1322 and a column address decoder 1328, respectively. The column address decoder 1328 selects bit lines extending through the array 1302 corresponding to respective column addresses. The row address decoder 1322 is connected to word line driver 1324 that activates respective rows of memory cells in the array 1302 corresponding to received row addresses. The selected data line (e.g., a bit line or bit lines) corresponding to a received column address are coupled to a read/write circuitry 1330 to provide read data to a data output buffer 1334 via an input-output data bus 1340. Write data are applied to the memory array 1302 through a data input buffer 1344 and the memory array read/write circuitry 1330. The read/write circuitry 1330 includes at least one current mode sense amplifier 1332 according to an embodiment of the invention. Read data and write data provided to the read/write circuitry 1330 is transmitted over input-output lines and are amplified by the sense amplifier 1332 to be provided to the output buffer 1334 and before being written to the memory array 1302.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A current mode sense amplifier, comprising:
first and second input/output nodes;
cross-coupled transistors, a first transistor of the cross-coupled transistors coupled to the first input/output node and a second transistor of the cross-coupled transistors coupled to the second input/output node;

a load circuit coupled to the cross-coupled transistors and to a ground and configured to provide a resistance to control at least in part the loop gain of the current mode sense amplifier, the load circuit including a first resistor coupled to a first transistor of the cross-coupled transistors and a second resistor coupled to a second transistor of the cross-coupled transistor;

a latch mode circuit coupled to the pair of cross-coupled transistors and to the ground, the latch mode circuit configured to increase a loop gain of the current mode sense amplifier when activated; and wherein a state sensed by the current mode sense amplifier is latched based on the latch mode circuit being activated and the load circuit being deactivated.

2. The current mode sense amplifier of claim 1 wherein the load circuit further comprises:
first and second active loads, each of the first and second active loads coupled to a respective one of the first and second resistors.

3. The current sense amplifier of claim 2 wherein the first and second active loads comprise field-effect transistors.

4. The current mode sense amplifier of claim 2 wherein the first and second active loads comprise field-effect transistors, each coupled in series with the respective one of the first and second resistors.

5. The current mode sense amplifier of claim 2 wherein the first and second active loads comprise field-effect transistors coupled in parallel with the respective one of the first and second resistors.

6. The current mode sense amplifier of claim 1 wherein the cross-coupled transistors comprise p-channel field effect transistors.

7. A current mode sense amplifier, comprising:
a pair of input/output modes;
a pair of cross-coupled field effect transistors, each field effect transistor of the pair of cross-coupled field effect transistors coupled to a respective input/output node of the pair of input/output nodes;
first and second resistors each of the first and second resistors coupled to a respective one of the pair of cross-coupled field effect transistors;
first and second active loads, each of the first and second active loads being coupled in series with a respective one of the first and second resistors and to a ground;
at least one additional active load coupled to at least one of the resistors;
a first latch load coupled to the first resistor and to the ground;
a second latch load coupled to the second resistor and to the ground, the first and second latch loads having greater resistance when activated than a combined resistance of the passive and active loads; and
wherein the current mode sense amplifier is configured to latch a sensed state when the first and second latch loads are activated and the first and the second active loads and the at least one additional active load are deactivated.

8. The current mode sense amplifier of claim 7 wherein the at least one additional active load comprises:
a first field effect transistor coupled in parallel with the first resistor; and
a second field effect transistor coupled in parallel with the second resistor.

9. The current mode sense amplifier of claim 7 wherein the at least one additional active load comprises first and second diode-coupled transistors, each of the first and second diode-coupled transistors coupled in parallel with a respective one of the first and second resistors.

10. The current mode sense amplifier of claim 7 wherein the pair of cross-coupled field effect transistors comprises a pair of p-channel field effect transistors having respective gates coupled to a drain of the other transistor.

11. The current mode sense amplifier of claim 7 wherein the first latch load and the second latch load are configured to increase a loop gain of the current mode sense amplifier when activated to latch a state sensed by the current mode sense amplifier.

* * * * *

UNITED STATES PATENT AND TRADEMARK OFFICE
CERTIFICATE OF CORRECTION

PATENT NO. : 8,705,304 B2  
APPLICATION NO. : 12/732968  
DATED : April 22, 2014  
INVENTOR(S) : Seong-Hoon Lee et al.

Page 1 of 1

It is certified that error appears in the above-identified patent and that said Letters Patent is hereby corrected as shown below:

In the Claims:

In column 7, line 9, in Claim 1, delete "transistor;" and insert -- transistors; --, therefor.

In column 7, line 22, in Claim 3, after "current" insert -- mode --.

In column 7, line 36, in Claim 7, delete "modes;" and insert -- nodes; --, therefor.

In column 8, line 1, in Claim 7, delete "resistors" and insert -- resistors, --, therefor.

In column 8, line 7, in Claim 7, delete "to" and insert -- to, --, therefor.

In column 8, line 7, in Claim 7, delete "least" and insert -- least, --, therefor.

In column 8, line 17, in Claim 7, after "first and" delete "the".

Signed and Sealed this  
Twenty-second Day of July, 2014

Michelle K. Lee  
*Deputy Director of the United States Patent and Trademark Office*